United States Statutory Invention Registration [19]

[11] Reg. Number: H104

Hung et al. [45] Published: Aug. 5, 1986

[54] DIGITAL RESOLVER COMPENSATION TECHNIQUE

[75] Inventors: James C. Hung; Stephen T. Hung, both of Knoxville, Tenn.

[73] Assignee: The United States of America as represented by the Secretary of the Army, Washington, D.C.

[21] Appl. No.: 740,695

[22] Filed: Jun. 3, 1985

[51] Int. Cl.[4] ..... H03M 1/00; G05D 23/275; G06G 7/19

[52] U.S. Cl. ..... 340/347 SY; 318/632; 364/576; 340/347 M

[58] Field of Search ..... 340/347 SY, 347 CC, 340/347 AD; 318/604, 632; 73/1 E; 364/576

[56] References Cited

U.S. PATENT DOCUMENTS 4,119,958 10/1978 Simon et al. ..... 318/604 X

*Primary Examiner*—Stephen C. Buczinski
*Assistant Examiner*—Linda J. Wallace
*Attorney, Agent, or Firm*—Robert C. Sims; Freddie M. Bush; Anthony Thomas Lane

[57] ABSTRACT

The technique compensates the resolver's output digitally by means of a digital processor and a predetermined resolver error characteristic. The technique uses a digitally compensated resolver which compensates by the use of a truncated Fourier series.

2 Claims, 3 Drawing Figures

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

DIGITAL RESOLVER COMPENSATION TECHNIQUE

DEDICATORY CLAUSE

The invention described herein was made in the course of or under a contract or subcontract thereunder with the Government and may be manufactured, used, and licensed by or for the Government for governmental purposes without the payment to us of any royalties thereon.

BACKGROUND OF THE INVENTION

Resolvers are used as angular transducers. There is a growing need of resolvers of high output accuracy and smaller physical size. Such requirements are very difficult to meet by resolver design alone. In fact, higher accuracy is associated with larger physical size and higher cost. This invention provides a digital compensation technique which can improve the accuracy of a resolver by a factor of approximately ten. A low-cost, small-size, medium-accuracy resolver can thus be made into a high-accuracy resolver by using this invention. The cost of using this technique is very small when compared to the cost of a small-size, high-accuracy resolver, if such a resolver exists.

SUMMARY OF THE INVENTION

This invention is a technique to greatly improve the accuracy of a resolver. The technique compensates the resolver's output digitally by means of a digital processor and a predetermined resolver error characteristic. Improvement of resolver accuracy by a factor of ten can be obtained. The technique has two distinct technical merits:

(1) The digitally compensated resolver is much less expensive than one of similar accuracy without digital compensation.

(2) The accuracy of many currently used resolvers can be greatly improved without costly hardward modification or replacement.

DESCRIPTION OF THE BEST MODE AND PREFERRED EMBODIMENT

Figure 1:
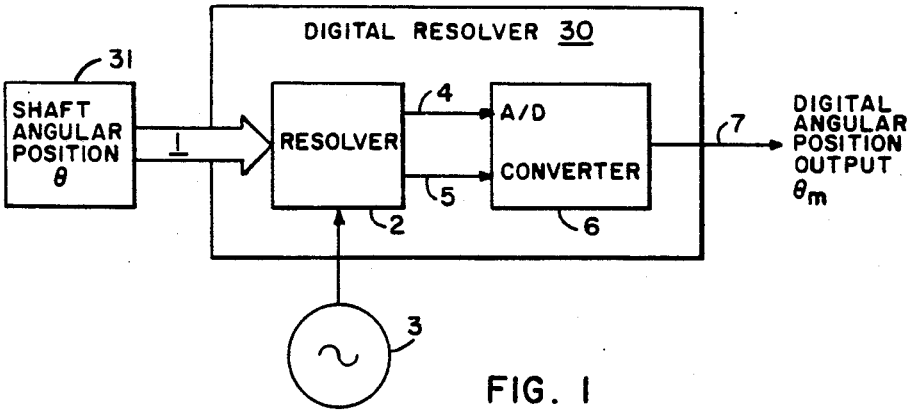
FIG. 1 illustrates a basic digital resolver measuring device.

FIG. 1 shows a digital resolver 30. The mechanical shaft angular position 31 is the input 1 to a resolver 2 whose rotor is excited by an alternating-current (AC) source 3 and whose two outputs 4 and 5 are converted by an analog-to-digital converter (ADC) 6 to a digital representation of the measured shaft angular position which is outputted at 7. Any known resolver having an analog voltage output which is proportional to the anuglar position input 1 can be used. Also, any well known digital resolver 30 may be used. Due to the ever-existent imperfection of the resolver 2, the measured shaft position as indicated by the digital signal at 7 is erroneous for almost any input shaft position at 1.

This invention is a technique which allows a digital processor to take the digital resolver's output signal at 7, compensate for its error, and output an estimate of the true shaft position which will have far less error. The technique consists of two parts, namely, (1) identification of the digital resolver's error characteristic, and (2) compensation of resolver output.

Identification of Error Characteristic

Figure 2:
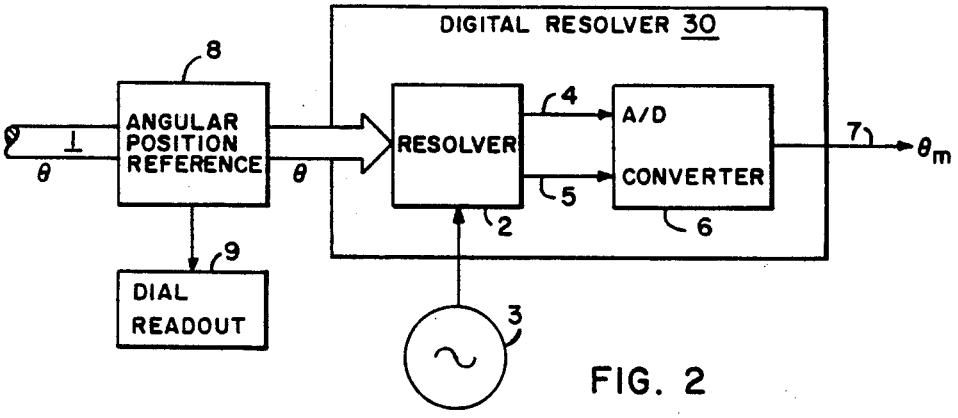
FIG. 2 illustrates a system for determining the errors in an angle readout system.

The characteristic of the resolver error is identified using a scheme as shown in FIG. 2. The input shaft 1 of the resolver is connected to an angular position reference (APR) 8. The APR is a mechanical device which has a dial readout 9 indicating the true shaft position accurate to a fraction of an arcsecond. The resolver shaft is rotated in m-degree incremental steps from 0 degree to 360 degrees for a total of n steps wherein $n=360/m$. The digital output 7 of the digital resolver 30 and the dial indication 9 of the APR at each incremental step position are then recorded. The difference of these two numbers is the resolver error e at that position. There are a total of n pieces of resolver error data corresponding to the n incremental step positions.

Through analysis, it has been found that the characteristic pattern of resolver error versus shaft position contains strong harmonic components. The resolver error is, therefore, approximated by a truncated Fourier series as follows.

$$e = A_O + \sum_{K=1}^{N} A_k \cos k\theta + \sum_{k=1}^{N} B_k \sin k\theta \tag{1}$$

wherein $A_O$, $A_k$, $B_k$, $k=1$ to N, are Fourier coefficients. There are a total of $2N+1$ Fourier coefficients. Values of these coefficients are identified from the recorded resolver error data using Fourier analysis. That is, they are determined by the following formulas.

$$A_O = \frac{1}{n} \sum_{j=1}^{n} e_j \tag{2}$$

$$A_k = \frac{2}{n} \sum_{j=1}^{n} e_j \cos k\theta_j, \; k = 1 \text{ to } N \tag{3}$$

$$B_k = \frac{2}{n} \sum_{J=1}^{n} e_j \sin k\theta_j, \; k = 1 \text{ to } N \tag{4}$$

where $e_j$ and $\theta_j$ are, respectively, the resolver error and the APR's dial readout at the j-th incremental step position. The integer N is selected in such a way that all $A_k$ and $B_k$ for $k>N$ are negligibly small.

Digital Compensation of Resolver Output

Figure 3:
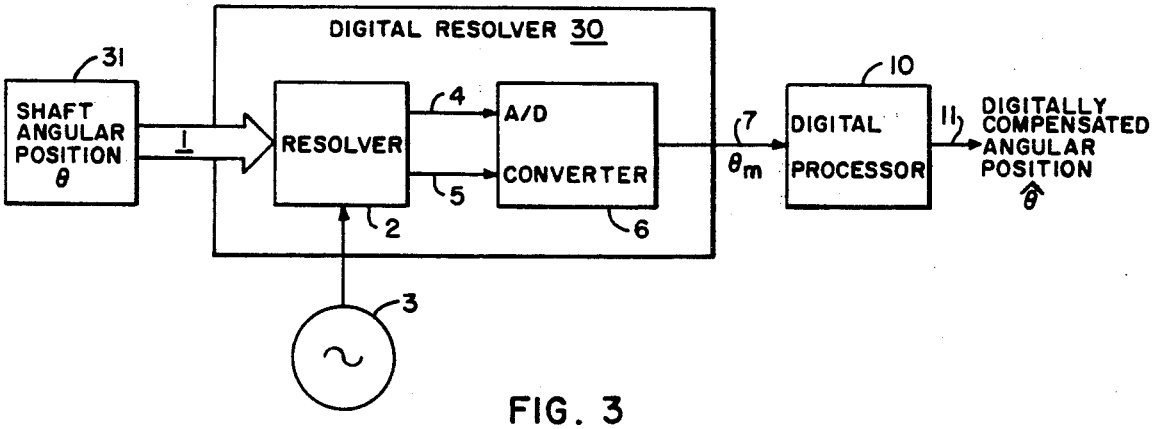
FIG. 3 illustrates a compensated digital resolver in accordance with the present invention.

FIG. 3 shows the block diagram of a digitally compensated resolver. The digital resolver measures a shaft angular position at 1. The measurement output at 7 is erroneous due to resolver imperfection. This output is received by a digital processor 10 which compensates for the resolver's measurement error by digital computation. The digital processor outputs a compensated angular position at 11. This digital processor may be either a microprocessor or a time-shared computer, which has sufficient memory to store the predetermined $2N+1$ Fourier coefficients. The formula for computing the digitally compensated shaft angular position $\hat{\theta}$ is given by $$\hat{\theta} = \theta_m - A_O - \sum_{k=1}^{N} A_k \cos k\theta_m - \sum_{k=1}^{N} B_k \sin k\theta_m \tag{5}$$

We claim:

1. In a system utilizing a digital resolver for reading angular position and which has error outputs due to imperfection of the system, the improvement comprising a method of determining the error characteristics of the system, representing this error characteristic in a Fourier series and utilizing a compensation means attached to an output of the system for inserting said Fourier series therein to compensate for the errors of the digital resolver.

2. A method as set forth in claim 1 wherein the Fourier series is represented by a truncated Fourier series.

* * * * *